United States Patent [19]

Cauceglia et al.

[11] 4,223,934

[45] Sep. 23, 1980

[54] TOOL TO INSERT AND EXTRACT PRINTED CIRCUIT BOARDS INTO AND OUT OF APPARATUS HOUSING CONNECTORS

[75] Inventors: Walter B. Cauceglia, Wayne; Walter H. Dieterle, Sparta; Gerald B. Fay, Cranford, all of N.J.

[73] Assignee: Bell Telephone Laboratories, Incorporated, Murray Hill, N.J.

[21] Appl. No.: 927,104

[22] Filed: Jul. 24, 1978

[51] Int. Cl.³ .............................................. B65G 7/02
[52] U.S. Cl. ...................................... 294/15; 294/34; 29/278; 29/764
[58] Field of Search .................... 294/15, 34, 26, 1; 29/747, 758, 759, 764, 278; 81/3 R, 38

[56] References Cited

U.S. PATENT DOCUMENTS

| | | | |
|---|---|---|---|
| 3,137,065 | 6/1964 | Harris | 294/34 |
| 3,178,214 | 4/1965 | Tinkeleberg | 294/15 |
| 3,484,129 | 12/1969 | Askren | 294/15 |
| 3,617,083 | 11/1971 | Koppensteinby | 294/15 |
| 3,903,596 | 9/1975 | Stein | 294/15 |
| 4,152,827 | 5/1979 | Walton | 29/764 |

*Primary Examiner*—James B. Marbert
*Attorney, Agent, or Firm*—Alfred G. Steinmetz

[57] ABSTRACT

An insertion-extraction tool to apply forces with mechanical advantage in the insertion and extraction of printed circuit boards into and out of an apparatus housing includes connecting means to secure the tool to the apparatus housing and engaging means to link with the printed circuit board being inserted and extracted.

12 Claims, 11 Drawing Figures

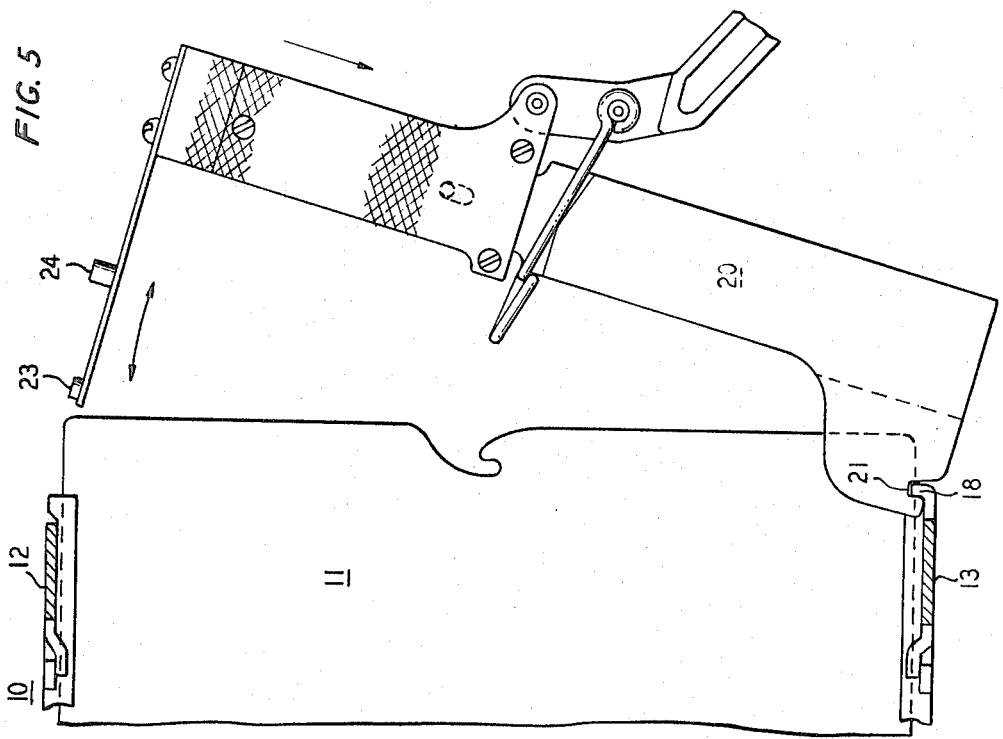
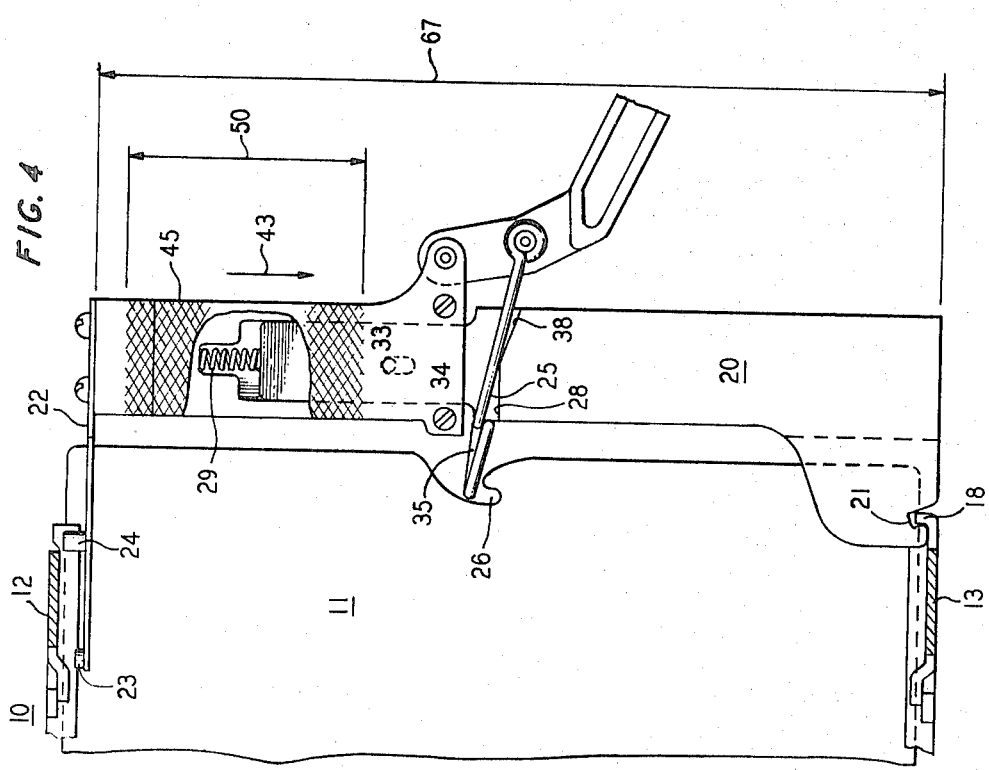

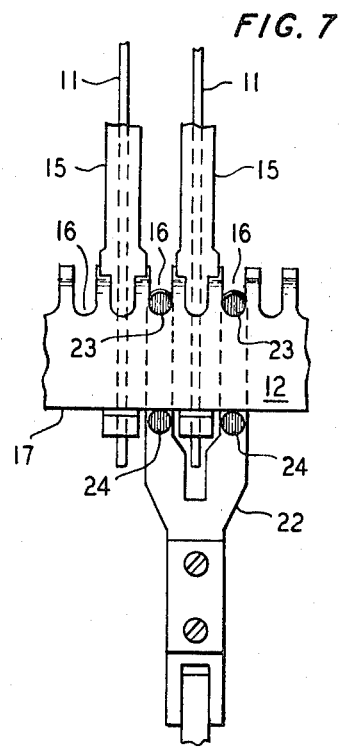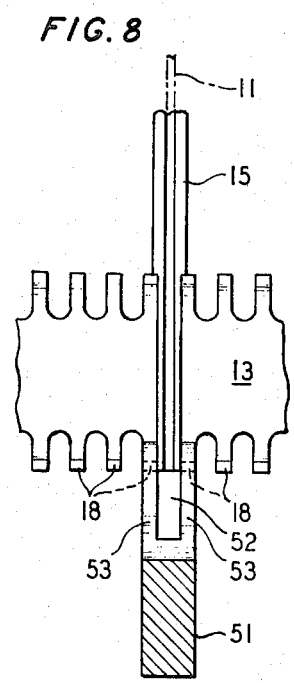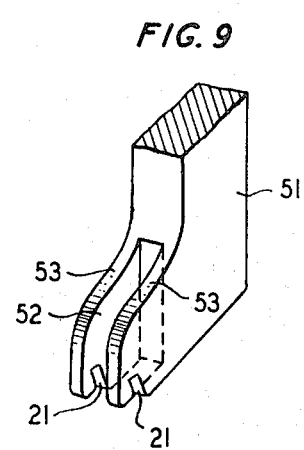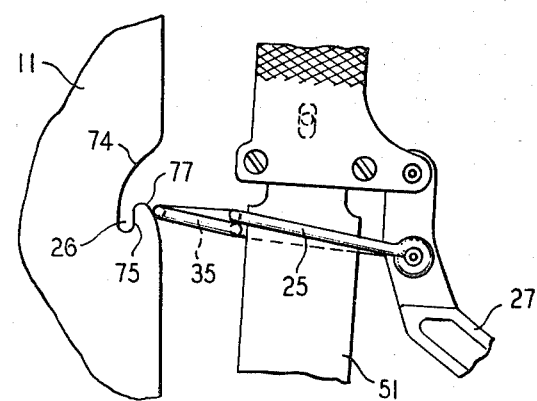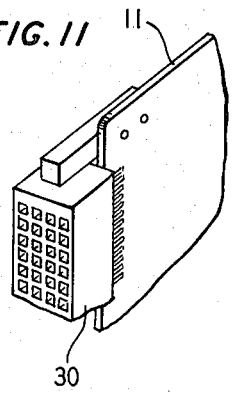

TOOL TO INSERT AND EXTRACT PRINTED CIRCUIT BOARDS INTO AND OUT OF APPARATUS HOUSING CONNECTORS

BACKGROUND OF THE INVENTION

1. Field of the Invention

The field of the invention is concerned with tools used to insert and extract printed circuit boards into and out of apparatus housings. It is more specifically concerned with such tools having a mechanical advantage to supply the necessary forces to engage and disengage multiple pin connections between the printed circuit board and the backplane connector of the apparatus housings.

2. Description of the Prior Art

Many tools operative to insert and extract printed circuit boards into and out of apparatus housings are essentially a handle substitute. These handle substitutes are adapted to attach to brackets on the printed circuit board and provide the convenience of a ready handclasp to apply the inserting and extracting forces. Examples of this handle substitute type tool are disclosed, for instance, in the U.S. Pat. Nos. 3,484,129, issued to S. G. Askren on Dec. 16, 1969; 3,617,083, issued to J. V. Koppensteiner on Nov. 2, 1971; and 3,903,576, issued to S. Stein on Sept. 9, 1975. The tools disclosed therein are essentially U-shaped detachable handles which are engaged with the printed circuit board to insert and extract it from the apparatus housing. These handles have two main component members, one being nested within the other, and slidable against a spring bias to activate connecting means which interlock with brackets on a printed circuit board.

No mechanical advantage to multiply an applied force is provided, the chief convenience being the provision of a ready grip.

In the instance of printed circuit boards having multiple pin connections between the board and the backplane of the apparatus housing, a mechanical advantage is a necessity. Forces necessary to engage and disengage multiple pin connectors may attain magnitudes as high as 75 pounds.

U.S. Pat. No. 3,178,214, issued to W. G. Tinkelenberg on Apr. 13, 1965 discloses a tool to insert and extract printed circuit boards from apparatus housings and includes operational features to provide a mechanical advantage to the extracting force. This tool is basically a combination handle and lever which has the same width as the printed circuit board. Two hooks at the outer edges of the tool are adapted to engage the outside corners of the printed circuit board. The tool is rotated about a heel structure which is located adjacent to the connecting hooks in order to apply an extraction force to the printed circuit board with mechanical advantage. This extracting force applied to the printed circuit board is sufficient to disengage the connecting pins of the connector of the printed circuit board from the backplane of the apparatus housing.

While this tool provides a mechanical advantage for extraction purposes, it serves merely as a handle for insertion purposes. In the case of a multiple pin connector, insertion forces can easily equal the force magnitude needed for extraction purposes.

Each of the tools described in the above reference requires careful positioning to engage the tool with a printed circuit board bracket. Two connecting devices must be lined up with receiving devices attached to the printed circuit board. Only one of these tools (described by Tinkelenberg) has mechanical advantage in applying force and this mechanical advantage occurs only in the extracting mode of operation.

A suitable tool for engaging and disengaging printed circuit boards having multiple pin connectors should have mechanical advantage in both insertion and extraction modes of operation to supply the necessary force which can easily reach 75 pounds. Further desirable attributes include ease of connection and disconnection of the tool from the printed circuit board, and compactness for easy storage.

SUMMARY OF THE INVENTION

Therefore, in accordance with the principles of the invention, a particular embodiment of a tool provides a mechanical advantage in both the insertion and extraction of printed circuit boards in order to supply sufficient force to engage and disengage a multiple pin connector.

The tool further features a connecting arrangement between the tool and the printed circuit board which provides ease of attachment with no tedious alignment or careful positioning. Manipulation of the tool is uncomplicated and simple.

A particular tool to insert and extract printed circuit boards from their apparatus housing comprises a main structural member and a spring-biased telescoping top housing connected as an extension to the main structural member. A connector at one end of the main support structure engages a lower support crossbar of the apparatus housing. A coupling at the other end located on the telescoping top housing engages an upper support crossbar of the apparatus housing. Connection to the apparatus housing is accomplished by positioning the connector on the lower crossbar, depressing the overall length of the tool, positioning the coupling to the upper crossbar and subsequently allowing the telescoping top portion to expand thereby securing the tool to the crossbars of the apparatus housing.

The tool includes a driving mechanism which exerts inserting and extracting forces on a catch slot included in the printed circuit board. This driving mechanism includes a horizontal, slidable driver having a connecting loop at its end to engage the catch slot of the printed circuit board. A lever attached to the tool and having a fulcrum bearing on the tool applies force to the slidable driver. This force is concentric with the center line of the printed circuit board. Simple rotation of the lever supplies the insertion and extraction forces with appropriate mechanical advantage to the printed circuit board. The motion of the horizontal, slidable driver is constrained with the center line of the circuit board by a guiding shoulder on the tool. This shoulder provides further bias to the latch via a cam action so that when the tool is depressed for extraction purposes the connecting loop automatically disengages from the catch slot of the printed circuit board.

The many advantages of this tool over the prior art are that the insertion and extraction forces provide a concentric drive with no skewing or warping since the force is applied to the center line of the printed circuit board. The tool is self-positioning with the connecting loop automatically connecting to and disengaging from the catch slot of the printed circuit board. It is compact, light weight, easy to store, and further provides a desired mechanical advantage which is determined by the length of the lever.

BRIEF DESCRIPTION OF THE DRAWING

The invention may be readily understood through reference to the description hereinbelow in combination with the drawing wherein the various figures are:

FIG. 4 is a partial side view with the insertion-extraction tool disconnected from the printed circuit board catch slot in preparation for being disengaged from the apparatus housing;

FIG. 5 is a partial side view with the insertion-extraction tool in the process of being completely disengaged from the apparatus housing;

FIG. 7 is a detailed fragmentary view showing the top crossbar of the apparatus housing to which the top of the insertion-extraction tool is attached;

FIG. 8 is a detailed fragmentary view showing the bottom crossbar of the apparatus housing to which the bottom of the insertion-extraction tool is attached;

FIG. 9 is a detailed fragmentary view showing the bottom of the insertion-extraction tool in detail;

FIG. 10 is a detailed fragmentary view showing a catch slot of a printed circuit board suitable for engagement with a latch of the insertion-extraction tool; and FIG. 11 shows a detailed fragmentary view of the plug connector attached to the back end of the printed circuit board.

DETAILED DESCRIPTION

Figure 1:
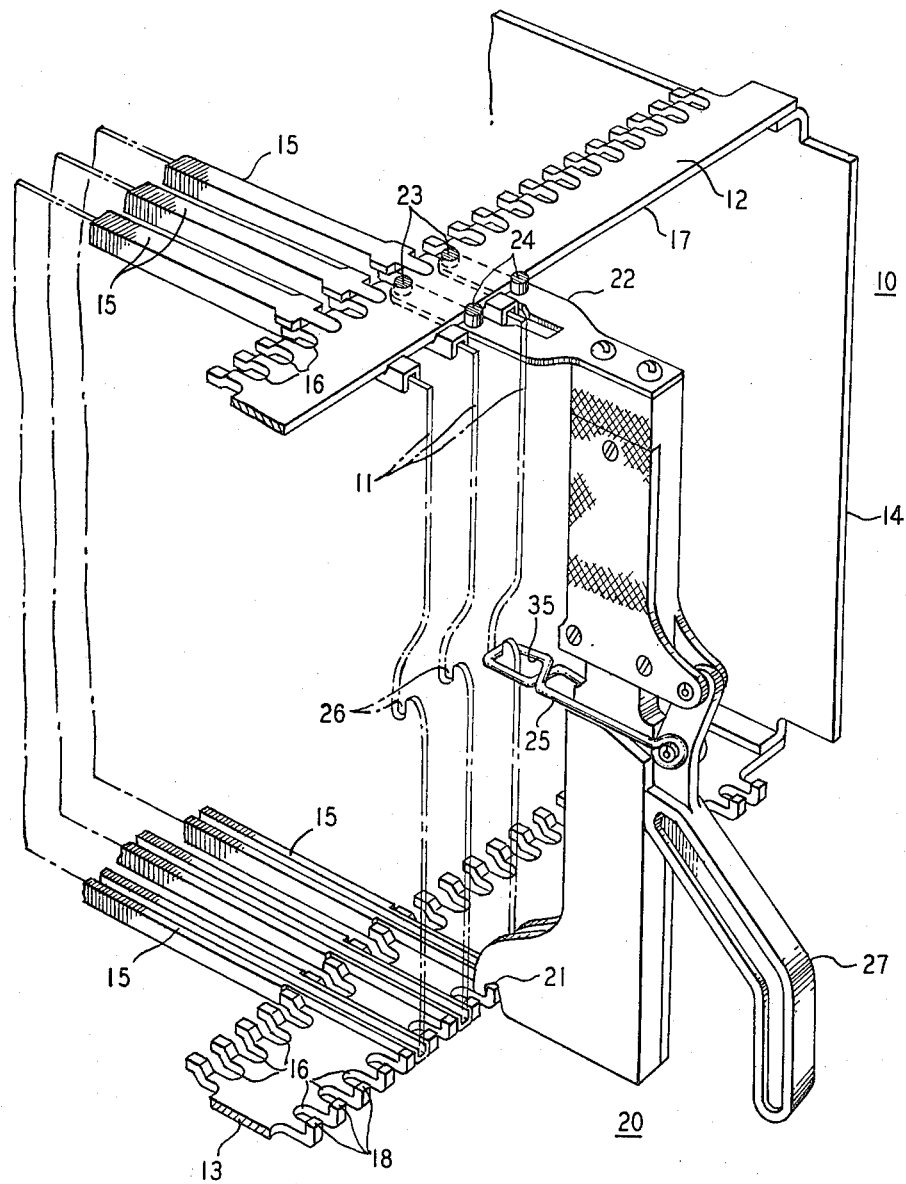
FIG. 1 is a perspective view of a portion of an apparatus housing, a printed circuit board contained therein, and an insertion-extraction tool embodying the principles of the invention attached thereto.

A perspective view shown in FIG. 1 shows a fragmentary portion of an apparatus housing 10 with a plurality of printed circuit boards 11 inserted therein and with the insertion-extraction tool 20 connected thereto. This perspective view shows the general environment in which the insertion-extraction tool 20 is utilized. Crossbars 12 and 13 are shown at both the top and bottom of the apparatus housing, respectively. These crossbars 12 and 13 provide the structural connection between sides 14 of the apparatus housing and provide support for tracks 15 into which the printed circuit boards 11 are inserted. Crossbars 12 and 13 also provide the connecting structure of the apparaus housing to which the insertion-extraction tool 20 is attached. As shown in FIG. 1, the printed circuit boards slide into tracks 15 which are located at alternate slots 16 in the crossbars. The printed circuit boards in this view (FIG. 1) are shown in their connected positions with the multiple pin connectors in the backplane engaged.

Top crossbar 12 of the apparatus housing 10 has a plurality of slots 16 at its rear edge and a smooth, straight front edge 17. Bottom crossbar 13 has slots 16 at both its front and rear edges. A series of lips 18 appear between the slots 16 at the front edge of the bottom crossbar 13. The functions of the lips 18 and the slots 16 are readily apparent from examination of how the insertion-extraction tool 20 is attached thereto. Tool 20 has notches 21 at its bottom end which engage with the lip 18 of the bottom crossbar. A bifurcated spring catch 22 with front and rear pins in each prong at the top of the tool 20 engages with the top crossbar 12. Pins 23 of the catch 22 engage with the slots 16 in the rear of the top crossbar 12 and pins 24 rest against the straight front edge 17 of the top crossbar 12.

In its connected position the tool 20 is firmly affixed to the apparatus housing 10 thereby permitting the insertion and extraction forces applied to the printed circuit board to be precisely directed and to secure the full benefits of the mechanical advantage afforded by the tool. Forces are applied to the printed circuit board 11 by a driving mechanism which includes a slidable driver designated as the latch 25 of tool 20 which includes a connecting loop 35 to engage with a catch slot 26 in the circuit board. Latch 25 is driven by a lever 27 of the tool 20 as described subsequently hereinbelow.

Figure 2:
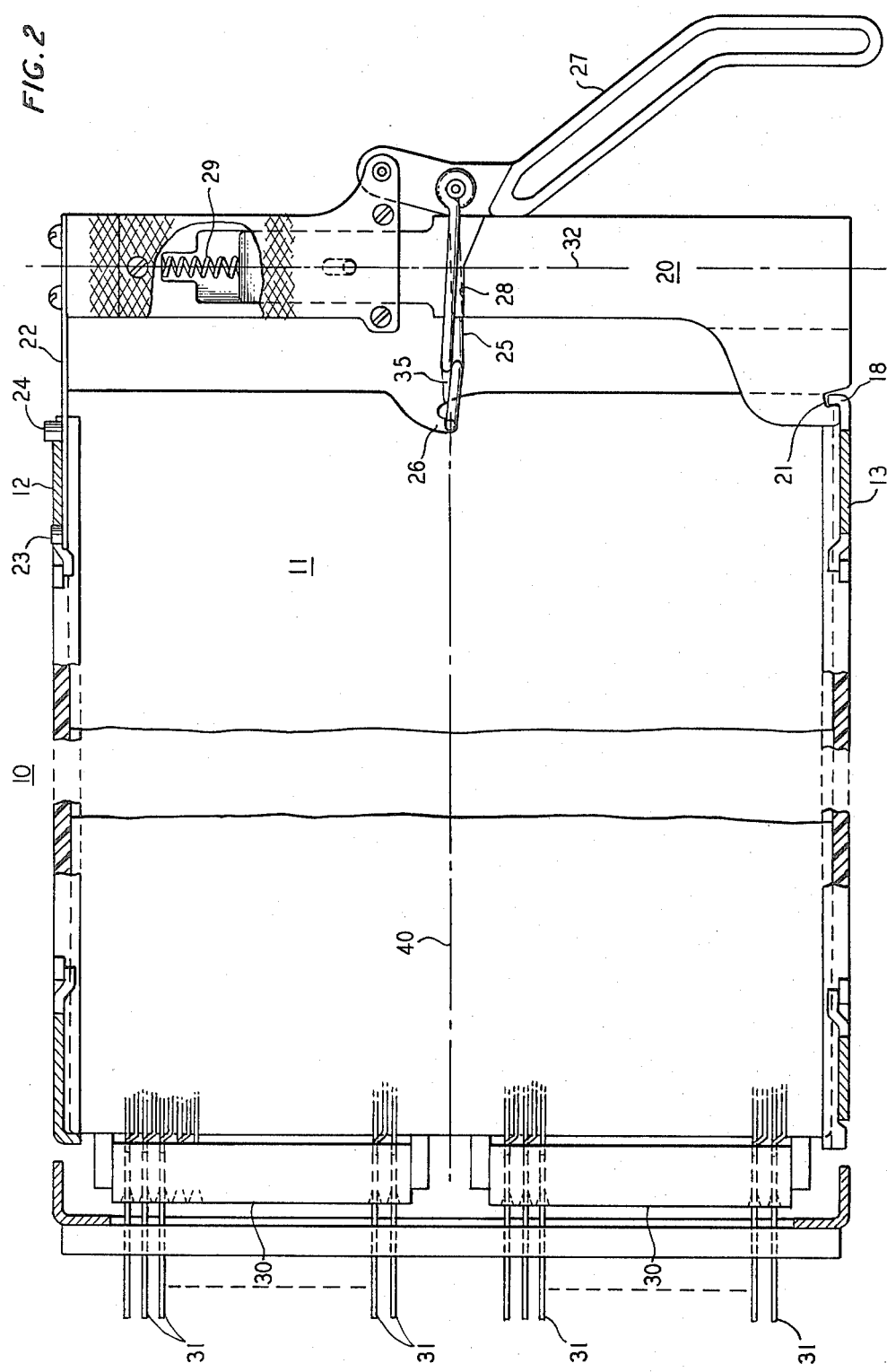
FIG. 2 shows a side view of a printed circuit board in position in the apparatus housing with the backplane connectors engaged and the insertion-extraction tool attached thereto.

In the side view shown in FIG. 2, the printed circuit board 11 is inserted into the apparatus housing with the back connector sockets 30 and prongs 31 fully engaged. The insertion-extraction tool 20 connected to the apparatus housing is shown in a position in which insertion of the circuit board is complete and it is ready to apply an extracting force thereto. Pins 23 and 24 in the bifurcated spring catch 22 at the top of the tool 20 are shown engaged with the top crossbar 12. At the bottom of the tool 20 a notch 21 fits over a lip 18 of the bottom crossbar 13 and with the spring catch 22 firmly secures the insertion-extraction tool 20 to the apparatus housing 10.

Latch 25 of the insertion-extraction tool 20 is shown with its connecting loop 35 firmly seated in a catch slot 26 included in the printed circuit board. Catch slot 26 is positioned on the center line 40 of circuit board 11. Latch 25 is constrained by design of tool 20 to apply insertion and extraction forces coincident with this center line 40 in response to operator forces applied to the tool handle or lever 27. This precise control of the direction of applied forces advantageously prevents skewing or warping of circuit board 11 during insertion and extraction.

A cutaway view of a portion of tool 20 in FIG. 2 shows a bias spring 29 internal to the tool and located along its longitudinal axis 32. This bias spring 29 permits extension and compression of the tool 20 and supplies the bias force which allows it to be attached and firmly secured to the bottom and top crossbars 13 and 12 of the apparatus housing.

Because of this secure attachment to the apparatus housing 10, the forces applied to the tool 20 through its lever or handle 27, and hence through the latch 25, are very precisely applied to the center line 40 of the printed circuit board 11 thereby preventing skewing or wedging during application of insertion and extraction forces.

Figure 3:
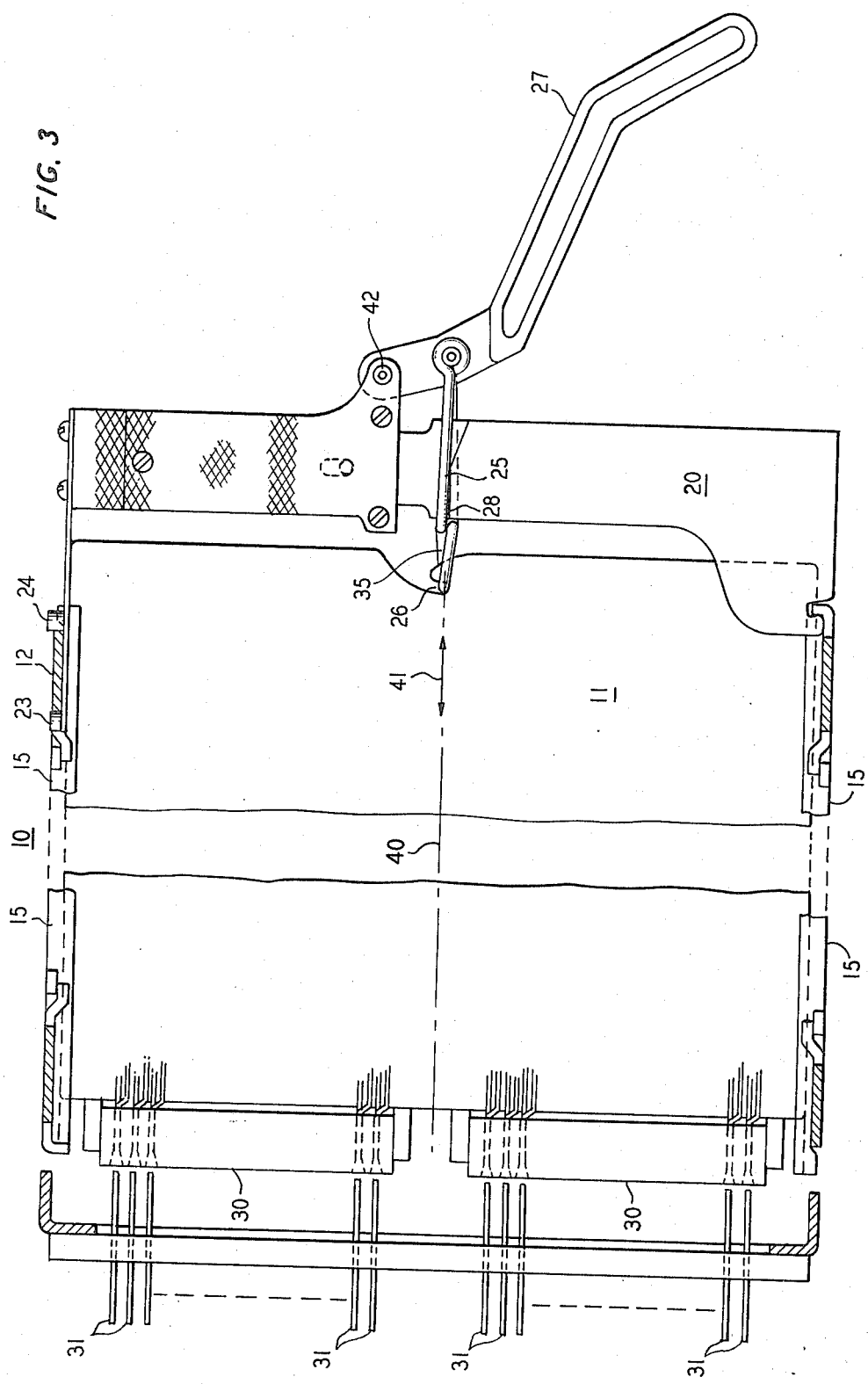
FIG. 3 is a side view similar to FIG. 2 but with the connectors in the backplane disengaged.

The direction of the applied insertion-extraction forces to the circuit board is readily apparent by inspecting FIG. 3 which is a similar side view to FIG. 2 but which shows the connector pins in the backplane of the apparatus housing disconnected from the sockets attached to the circuit board. Arrow 41 shows the direction of application of the insertion and extraction forces. As shown in FIG. 3, the handle 27 of the insertion-extraction tool 20 has been pulled outward. Force multiplication provided by the handle 27 which rotates about a fulcrum bearing 42 mounted in the tool 20 causes a significant force to be applied to the latch 25 which is engaged with the catch slot 26 of the printed circuit board 11.

Catch slot 26 is located at the center line of the circuit board. Movement of the latch 25 is constrained by the tool 20 to be along the same center line. As shown, latch 25 rests upon a flat, horizontal shoulder 28 cut into the side of tool 20 and aligned with center line 40. The motion of the latch 25 in response to movement of handle 27 is along the center line 40. Hence, all insertion and extraction forces applied to the printed circuit board are constrained to be along the center line 40 as shown by the arrow 41. Printed circuit board 11 in response to the applied force slides along the tracks 15 contained in the apparatus housing and engages and disengages in a linear direction from the prongs 31 contained in the backplane of the apparatus housing 10.

The connection and disconnection of the insertion-extraction tool from the apparatus housing is readily apparent through examination of FIGS. 4 and 5. FIGS. 4 and 5 show in sequence the procedure to disconnect the insertion-extraction tool 20 from the crossbars 12 and 13 of the apparatus housing 10. Once the printed circuit board 11 has been disengaged from the backplane connectors, the first step in disengaging the tool 20 from the apparatus housing as shown in FIG. 3 consists of grasping the tool 20 at the knurled region 50 and pressing downward as shown by arrow 43 against the bias spring 29 and the lower crossbar 13 so that the pins 23 and 24 in the top bifurcated spring catch 22 are disengaged from their connection with the top crossbar 12.

Reduction in the lateral dimension 67 of the insertion-extraction tool is permitted since the top and bottom of the tool are movable relative to each other. This lateral dimension 67 is controlled by spring 29 and by a pin 33 which fits into a slot 34 in the tool and limits the minimum and maximum length of the tool. With no external force applied to the tool 20 of the spring 29 retains the pin 33 against the bottom end of slot 34 and the tool 20 is at its maximum length. An externally applied compression force will reduce the length of the tool 20 to the extent permitted by the pin 33 and slot 34 as shown in FIG. 4.

The latch 25 slides along a two-slope camlike shoulder comprising surfaces 28 and 38 on the sides of the tool 20. Surface 28 is horizontal and, as discussed above, controls the direction of force applied by latch 25 to the catch slot 26. The back camlike surface 38 has a predetermined slope which, as shown in FIG. 4, permits the latch to rotate and lift out of the catch slot 26 when the length of the tool is reduced by depressing its top member 45 against the lower crossbar 13. Depressing the top member 45 of the tool 20 against the bottom crossbar 13 accomplishes two functions: it disengages the top spring catch from the top crossbar; and it disengages the latch 25 from the catch slot in the printed circuit board.

To subsequently remove the tool from the apparatus housing, it is merely rotated outward as shown in FIG. 5 about the connection of the tool to the lip 18 of the lower crossbar 13. Once the tool has been rotated, it can be released allowing it to return to its normal spring-biased length dimension and lifted clear of the apparatus housing 10.

Attaching the tool to the apparatus housing is accomplished by reversing the steps used in its removal. One merely connects the notch 21 of the tool to the lip 18 of the lower crossbar 13 as shown in FIG. 5 and then depresses the tool and rotates it into position as shown in FIG. 4. The tool is then released and it connects to the apparatus housing 10 and the circuit board latch slot 26, as shown in FIG. 3. The handle 27 is pushed forward to cause the circuit board connector sockets 30 to engage the multiple prongs 31 in the backplane thereby connecting the printed circuit board, as shown in FIG. 2. The removal procedure as described above is then used to remove the tool from the apparatus housing.

Figure 6:
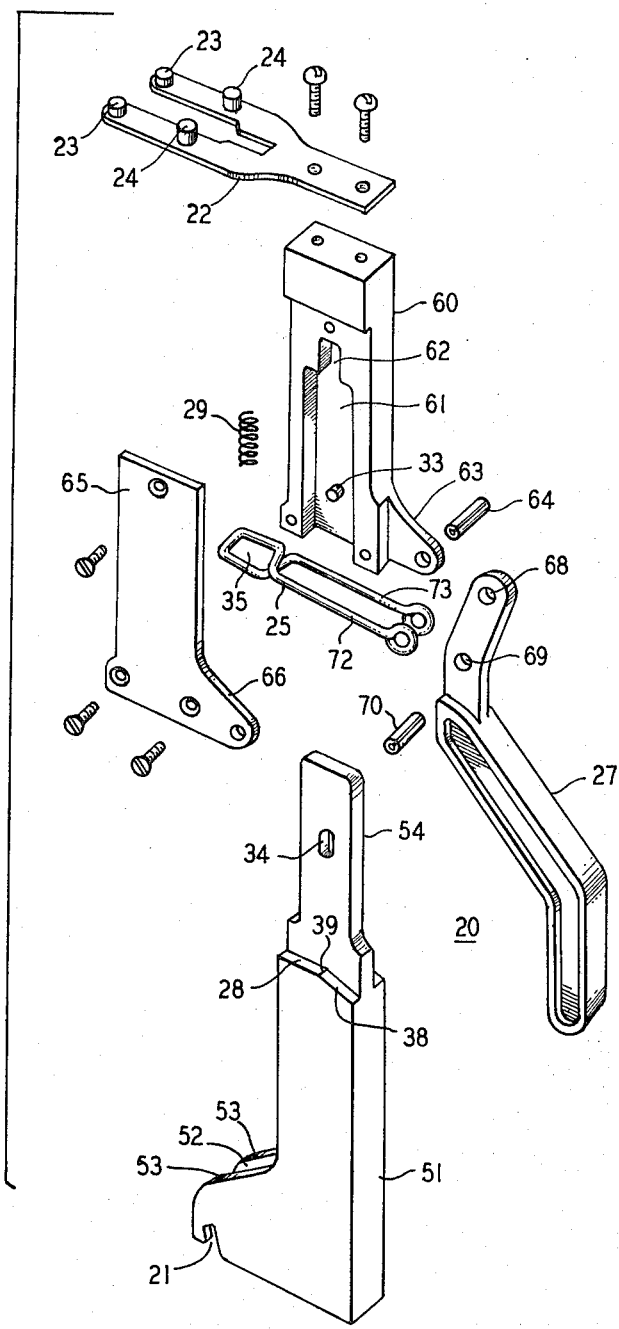
FIG. 6 is an exploded view of the insertion-extraction tool which shows the various individual components thereof in detail.

The various component parts comprising this insertion-extraction tool 20 can be readily ascertained from the exploded view of the tool as shown in FIG. 6. A bottom main structural member 51 of the tool 20 has a bifurcated shoulder 53 at its bottom which provides a furrow 52 to fit around the printed circuit board when the tool is attached to the apparatus housing. Connection details can be readily ascertained by referring back to FIG. 1. It has two notches 21 which fit the lips 18 of the lower crossbar. A top plunger-type section 54 of this main structural member 51, as is evident, is reduced in cross section, first at the sides and then in the depth dimensions. The first size reduction forms two shoulders 28 and 38 along each side of the tool wherein shoulder 28 has a front flat slope to guide the connecting loop 35 of the latch 25 to permit engagement with the catch slot 26 and behind an apex 39, shoulder 38 has a second slope to operatively promote disengagement of the latch 25 from the catch slot 26. As described above, the apex 39 and the second slope of shoulder 38 provide a camlike action when the tool is depressed causing the latch 25 to rotate upward to facilitate extraction of the tool from the catch slot of the printed circuit board. The reduced cross section of the plunger-type top section 54 is designed to fit in a cavity in a top housing 60 and includes a slot 34 which in combination with a pin 33 included in the top housing 60 limits the lateral motion between the main structural member 51 and the top housing 60.

The top housing 60 is designed with a first cavity 61 cut therein to accept the plunger or reduced cross-section portion of the main structural member. A second cavity 62 just beyond the first cavity 61 is connected thereto to accept a bias spring 29 which tends to bias the respective positions of the structure and housing to maintain a maximum longitudinal dimension controlled by pin 33 and slot 34.

Pin 33 is set into the cavity 61 and mates with the slot 34 shown in the plunger 54 of the main structural member 51 and, as described below, operates to limit the relative motions of the top and bottom structures. Pin 33, if desired, may be fixed to the plunger 54 and the slot 34 may be cut into the top housing 60 or into the cover plate 65.

At one side of the top housing is a cantilevered pad 63 extending out from the main body of the top housing 60 and including a hole to accept one end of a pin 64. This pin 64 acts as a fulcrum bearing for the handle 27.

A cover plate 65 is screwed to the top housing 60 to enclose the cavities 61 and 62 which accept the plunger-type top section 54 of the main structural member 51. Cover plate 65 also includes a cantilevered pad 66 with a hole to support the other end of the main fulcrum bearing pin 64.

The handle 27 supported by pin 64 is, as shown, conveniently S-shaped similar to a bell crank to permit the hand to grasp it without interference from the main structural member 51. It has a hole 68 through which the fulcrum bearing pin goes and about which it rotates.

A second hole 69 in the handle 27 accepts a pin 70 to which the latch 25 is connected.

The latch 25 is attached to the handle 27 by pin 70 and it is through this pin 70 that forces from the handle 27 to the latch 25 are applied. This latch 25 may be constructed of spring steel and appropriately looped so that a closed or connecting loop 35 is formed to attach to the catch slot 26 of the printed circuit board. Two side members 72 and 73 are formed which ride along the shoulder 28 cut into the side of the main structural member.

A bifurcated spring catch 22 is screwed to the top housing 60 of the tool. The spring catch 22 is bifurcated having two prongs which fit on opposite sides of the printed circuit board. Each prong has two pins 23 and 24 which engage the slots in the rear of the top crossbar and the front edge of the top crossbar, respectively.

It will be evident to those skilled in the art that an insertion and extraction tool embodying the principles of the invention may be constructed from a plurality of suitable materials. In the particular illustrative embodiment disclosed herein, the main structural member 51, the top housing 60, the cover plate 65, and the handle 27 may be made of die cast aluminum alloy. The bifurcated spring catch 22 may be made of blue tempered clock spring steel and the latch 25 may be made of music wire.

Details of the connection of the bifurcated spring catch 22 to the top crossbar 12 are illustrated in a fragmentary view shown in FIG. 7. Rear pins 23 fit into the slots 16 at the rear of the top crossbar 12. Front pins 24 engage the front edge 17 of the top crossbar 12. The tracks 15 containing the particular printed circuit board engaged with the tool are located between the two prongs of the bifurcated spring catch 22.

Similarly, the connection of the tool to the bottom is shown in detail in FIG. 8. Two shoulders 53 at the bottom of the tool having a furrow 52 therebetween attach to the lips 18 on the bottom crossbar 13 on each side of the printed circuit board 11 inserted in the track 15. As shown in FIGS. 7 and 8, the attaching mechanism at both top and bottom are bifurcated with sufficient depth at the furrow to provide room for the necessary lateral motion of the printed circuit board to permit engagement and disengagement of the multiple pin connectors located in the backplane of the apparatus housing.

FIG. 9 shows in detail the two bottom shoulders 53 at the bottom of the insertion-extraction tool. The furrow 52 which surrounds the printed circuit board is clearly shown as are the two notches 21 which engage the lips 50 of the bottom crossbar. Note the off-perpendicular angle of the bottom notches 21 permitting easy rotation of the insertion-extraction tool about these lips.

The catch slot 26 to which the latch 25 of the tool attaches is shown in detail in the fragmentary view shown in FIG. 10. This catch slot 26 is designed to permit the connecting loop 35 of the latch to automatically engage when the tool is inserted in place. The front edge 77 of the catch slot is angled as a ramp to permit the latch 25 to ride up the ramp and finally drop in and engage the slot when the tool is inserted. The far edge 74 of the catch slot 26 has a large radius which is sufficient to permit the latch 25 to rotate out of the slot when the tool is depressed as shown previously in FIG. 4. Note also that the interior edge 75 of the catch slot has a slight negative bias ramp angle to insure that the connecting loop 35 of the latch stays in the slot when extraction forces are applied to the board.

FIG. 11 is a detailed view of one of the multiple prong socket connectors 30 contained at the back of the printed circuit board. It is readily apparent from the plurality of prong sockets that considerable force is necessary to insert and extract the printed circuit board.

While one particular embodiment of the insertion-extraction tool embodying the principles of the invention has been disclosed, it is understood that many alternative embodiments may be devised without departing from the spirit and scope of the invention.

We claim:

1. A tool (20) for inserting and extracting circuit boards (11) into and out of a circuit board apparatus housing (10), wherein the improvement comprises:
   first and second connecting means (21, 22) at ends of the tool and operative to positively interlock with corresponding structural parts (12, 13) of said apparatus housing;
   a driving mechanism (25, 27) adapted to engage a circuit board and operative to apply inserting and extracting forces thereto greater in magnitude than activating forces applied to said driving mechanism by translating an added distance of the activating force into an added magnitude of the inserting and extracting forces, said inserting and activating forces operating along a predetermined line of action, whereby said first and second connecting means permits the circuit board apparatus housing to apply forces to said tool in reaction to said inserting and extracting forces.

2. A tool as defined in claim 1 wherein said driving mechanism comprises:
   a slidable driver (25) including a connecting loop (35) to engage a catch slot (26) in a circuit board in order to exert inserting and extracting forces.

3. A tool as defined in claim 2 wherein the improvement further comprises:
   a horizontal support shoulder (28) cut into a side of said tool and upon which said slidable driver rides in order to constrain a direction of insertion and extraction forces to be along a predetermined line of action (41) which is in agreement with a center line (40) of the circuit board.

4. A tool as defined in claim 2 wherein said driving mechanism further includes a lever (27) having a pivot support (64) on said tool and connected to operate said slidable driver in response to motion of the lever.

5. A tool as defined in claim 1 wherein the improvement further comprises a main structural member (51) and a spring biased top housing (60) movable with respect to the main structural member.

6. A tool as defined in claim 5 wherein said first connecting means includes a notch (21) at one end of said main structural member adapted to engage a lower support bar (13) of said apparatus housing.

7. A tool as defined in claim 6 wherein said second connecting means includes a catch (22) adapted to engage an upper support bar (12) of said apparatus housing and attached to said spring biased top housing and positioned at an end of the tool opposite said one end.

8. A tool as defined in claim 7 wherein said catch is bifurcated to permit movement of the circuit board therebetween.

9. A tool as defined in claim 5 wherein said top housing has a cavity (61) and said main structural member a plunger member (54) to fit within said cavity.

10. A tool as defined in claim 9 wherein a spring (29) is included with the cavity and a pin (33) in the top housing engages a slot (34) in the plunger to limit lateral relative motion of the top housing and the main structural member.

11. A tool (20) for inserting and extracting circuit boards (11) into and out of a circuit board apparatus housing (10), said tool comprising:
   a main structural member (51);
   a first connecting means (21) at an end of said main structural member and operative to engage a lower support bar (13) of said apparatus housing;
   a spring biased top housing (60) movable with respect to the main structural member and including a second connecting means (22) at its end operative to engage an upper support bar (12) of said apparatus housing;
   a driving mechanism (25,27) operative to engage a circuit board and apply force thereto including a slidable driver (25) including a connecting loop (35) to engage a catch slot (26) in the circuit board and having its opposite end pivotally attached to a lever (27) having a pivot support on said main structural member, and
   support means (28) to constrain movement of said slidable driver to apply force to the circuit board in order to effect insertion into and extraction from the apparatus housing.

12. A tool (20) for inserting and extracting circuit boards (11) into and out of a circuit board apparatus housing (10) wherein the improvement comprises:
   connecting means (21, 22) operative to positively interlock with structure of the apparatus housing; and
   driving means (25, 27) to engage a circuit board and including a lever means to apply inserting and extracting forces thereto greater than an activating force applied to said lever means by translating an added distance of the activating force to an added magnitude of the inserting and extracting forces, said forces operating along a predetermined line of action, whereby said connecting means transmits reaction forces from said circuit board apparatus housing to said tool.

* * * * *

UNITED STATES PATENT AND TRADEMARK OFFICE
CERTIFICATE OF CORRECTION

PATENT NO. : 4,223,934
DATED : September 23, 1980
INVENTOR(S) : Walter B. Cauceglia, Walter H. Dieterle and Gerald B. Fay It is certified that error appears in the above—identified patent and that said Letters Patent is hereby corrected as shown below:

Column 5, line 38 "of the spring 29" should read --the spring 29--.

Signed and Sealed this

Nineteenth Day of May 1981

[SEAL]

Attest:

RENE D. TEGTMEYER

Attesting Officer

Acting Commissioner of Patents and Trademarks